United States Patent
Kubo

(10) Patent No.: US 7,184,127 B2
(45) Date of Patent: Feb. 27, 2007

(54) EXPOSURE APPARATUS HAVING SEPARATELY SUPPORTED FIRST AND SECOND SHADES AND METHOD FOR MANUFACTURING SEMICONDUCTOR DEVICE

(75) Inventor: Hiroyoshi Kubo, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 11/108,716

(22) Filed: Apr. 19, 2005

(65) Prior Publication Data

US 2005/0237503 A1 Oct. 27, 2005

(30) Foreign Application Priority Data

Apr. 23, 2004 (JP) .............................. 2004-128679

(51) Int. Cl.
*G03B 27/42* (2006.01)
*G03B 27/62* (2006.01)
*G03B 27/72* (2006.01)

(52) U.S. Cl. .............................. 355/71; 355/53; 355/75
(58) Field of Classification Search .................. 355/53, 355/69, 75, 71
See application file for complete search history.

(56) References Cited

U.S. PATENT DOCUMENTS

| 4,874,954 | A | 10/1989 | Takahashi et al. | .......... 250/548 |
|---|---|---|---|---|
| 5,473,671 | A | 12/1995 | Nishi | ............. 355/53 |
| 5,591,958 | A * | 1/1997 | Nishi et al. | ................. 250/205 |
| 5,854,671 | A | 12/1998 | Nishi | ............. 355/53 |
| 6,078,381 | A | 6/2000 | Suzuki | .......... 355/53 |
| 6,359,678 | B1 | 3/2002 | Ota | ............. 355/53 |
| 6,411,364 | B1 * | 6/2002 | Suzuki | .......... 355/53 |
| 6,462,807 | B1 | 10/2002 | Nishi | ............. 355/53 |
| 6,476,904 | B1 | 11/2002 | Kubo | ............. 355/55 |
| 6,707,536 | B2 | 3/2004 | Nishi | ............. 355/53 |
| 6,771,351 | B2 | 8/2004 | Kubo | ............. 355/55 |
| 2003/0031017 | A1 | 2/2003 | Tsuji | ............. 362/268 |
| 2004/0119959 | A1 | 6/2004 | Nishi | ............. 355/53 |
| 2005/0012913 | A1* | 1/2005 | Verweij et al. | ................ 355/53 |

FOREIGN PATENT DOCUMENTS

| JP | 4-196513 | 7/1992 |
|---|---|---|
| JP | 11-219900 | 8/1999 |
| JP | 11-329954 | 11/1999 |
| JP | 3209294 | 7/2001 |
| JP | 2003-45784 | 2/2003 |

* cited by examiner

*Primary Examiner*—Henry Hung Nguyen
*Assistant Examiner*—Chia-how Michael Liu
(74) *Attorney, Agent, or Firm*—Fitzpatrick, Cella, Harper & Scinto

(57) ABSTRACT

Excellent exposure performance is achieved by disposing a shade system in the vicinity of a mask. An exposure apparatus exposes a mask mounted on a first table using an illumination apparatus. The illumination apparatus illuminates the mask with light from a light source. The first table is provided with a shade system including shades formed of a material absorbing EUV light. The shade system obstructs unnecessary light that does not contribute to the exposure.

17 Claims, 13 Drawing Sheets

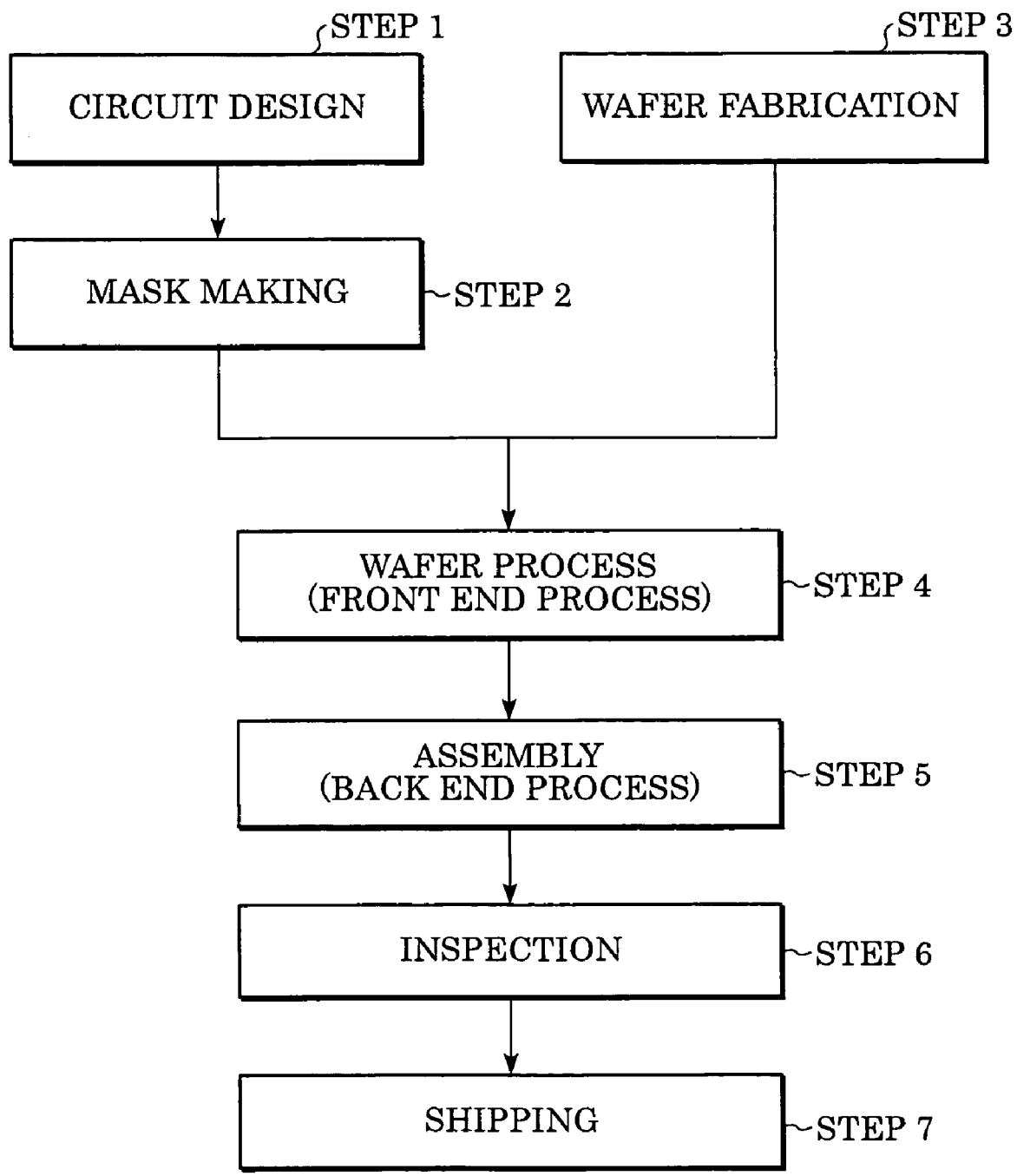

EXPOSURE APPARATUS HAVING SEPARATELY SUPPORTED FIRST AND SECOND SHADES AND METHOD FOR MANUFACTURING SEMICONDUCTOR DEVICE

BACKGROUND OF THE INVENTION

1. Field of the Invention

The present invention relates to an illumination apparatus used for an exposure apparatus. The illumination apparatus uses a light source that emits light in the extreme ultraviolet (EUV) range of 200 nm to 10 nm or in the X ray range. The illumination apparatus exposes an object such as a monocrystal substrate for a semiconductor wafer or a glass substrate for a liquid crystal display (LCD). The present invention also relates to an exposure apparatus and a method for manufacturing a semiconductor device.

2. Description of the Related Art

Japanese Patent Laid Open Application No. 11219900 discloses a masking blade that includes a variable blade for restricting the field. The variable blade is disposed adjacent to the underside (the side on which EUV light beam is incident) of the mask. A variable blade has an arcshaped slit as disclosed in Japanese Patent Laid Open Application No. 2003045784. The width of the arcshaped slit needs to be partly variable.

Japanese Patent Laid Open Application No. 04196513 discloses a variable blade that operates in accordance with the transfer region of a mask. Such a variable blade operates in a synchronized manner with the velocity of a mask stage so as to obstruct light in the nontransfer region.

Particularly in the case of an EUV light source, a variable blade has an arcshaped slit. As shown in FIG. 10, an arcshaped illuminated region 105 is formed on a mask 101 by a variable blade having an arcshaped opening. A part 106 of an element pattern region 103 of the mask 101 has already been exposed. However, a test pattern region 104 has also been exposed. Whether the mask 101 has a test pattern or not, a shade region 102 is always exposed. Therefore, due to a defect in shading of the mask 101, a small amount of light is projected on the wafer. Since the element is rectangular and the light to be projected is arcshaped, however the blade is moved, this problem cannot be solved.

As shown in FIG. 11, masking blades 115 and 116 are disposed in a recess of a base 114 of a mask stage 112. This deteriorates the rigidity and accuracy of the mask stage 112. In addition, since the masking blades 115 and 116 are separated from a mask 111 by the thickness of the base 114, blur occurs. Therefore, when the center 113 of the light beam is in the position shown in FIG. 11, optically sufficient shading cannot be performed.

In order to increase productivity, the mask stage 112 moves at a high speed. Since the masking blades 115 and 116 are synchronized with the mask stage 112, they need to move at a high speed. Therefore, a linear motor is used as an actuator for them. Since the actuator is disposed in the recess of the base 114, the design is difficult. This deteriorates the reliability of the mask stage 112. In the case where the width of the slit is adjusted in accordance with the image height, more actuators are needed. This makes the design more difficult and further deteriorates the reliability.

SUMMARY OF THE INVENTION

The present invention provides an exposure apparatus in which a masking blade can be disposed in the vicinity of a mask and excellent exposure performance is achieved.

In the present invention, an exposure apparatus includes a movable table on which a mask is mounted, and a shade system obstructing part of light radiated to the mask. The shade system includes (a) a first shade for forming a slit-shaped range of illumination of the mask, and (b) a second shade limiting a range of exposure of the mask. The first shade and the second shade are supported separately. In this exposure apparatus, when the shades are moved, the effect of vibration transmitted to the table is small. In addition, the shades can be disposed in the vicinity of the mask. Therefore, exposure performance is improved.

The shade system may further include (c) a first drive mechanism driving the first shade, and (d) a second drive mechanism driving the second shade. The first drive mechanism is supported by a movable table moving together with the table. The second drive mechanism is supported by a fixed body supporting the movable table.

The second shade may be supported by a base supporting a projection optical system.

In another aspect of the present invention, the first shade and the second shade are formed of a material absorbing EUV light.

In a still further aspect, the present invention relates to a method for manufacturing semiconductor devices, the method comprising the steps of exposing a wafer by using the exposure apparatus of the present invention and developing the wafer.

In yet another aspect, the present invention relates to an exposure apparatus comprising (1) a movable table on which a mask is mounted, and (2) a shade system obstructing a part of light radiated toward the mask, the shade system comprising (a) a first shade obstructing light for limiting an exposure range in a first direction that the movable table moves, (b) a second shade obstructing light for limiting an exposure range in a second direction perpendicular to the first direction, and (c) a third shade for forming a slitshaped range of illumination of the mask, wherein the first shade, the second shade, and the third shade are supported separately.

In a still further aspect, the present invention relates to an exposure apparatus comprising: (1) a base; (2) a stage device for supporting a mask, the stage device being movably mounted on the base so as to be movable relative to the base; (3) a first shade comprising two blades configured to have an arcshaped slit therebetween so as to form an arcshaped slit range of illumination of the mask, the two blades being movably mounted on the stage device so as to be movable relative to the stage device; and (4) a second shade configured to adjustably limit a range of exposure of the mask, the second shade not being mounted on the stage device.

Further features and advantages of the present invention will become apparent from the following description of exemplary embodiments with reference to the attached drawings.

BRIEF DESCRIPTION OF THE DRAWINGS

FIG. 13 shows the flow of the whole manufacturing process of a semiconductor device.

DESCRIPTION OF THE EMBODIMENTS

Embodiments of the present invention will now be described with reference to the drawings.

First Embodiment

Figure 2:
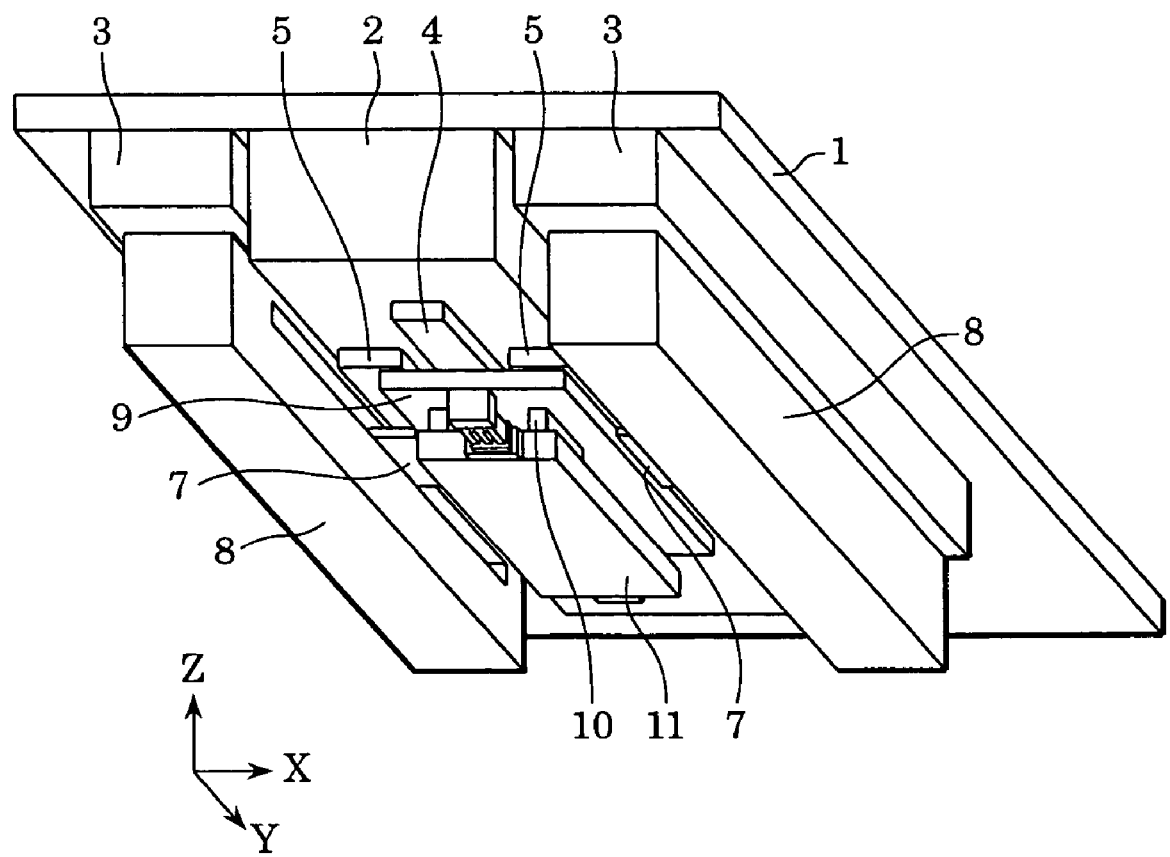
FIG. 2 is a schematic perspective view of a mask stage according to embodiments of the present invention.
Figure 3:
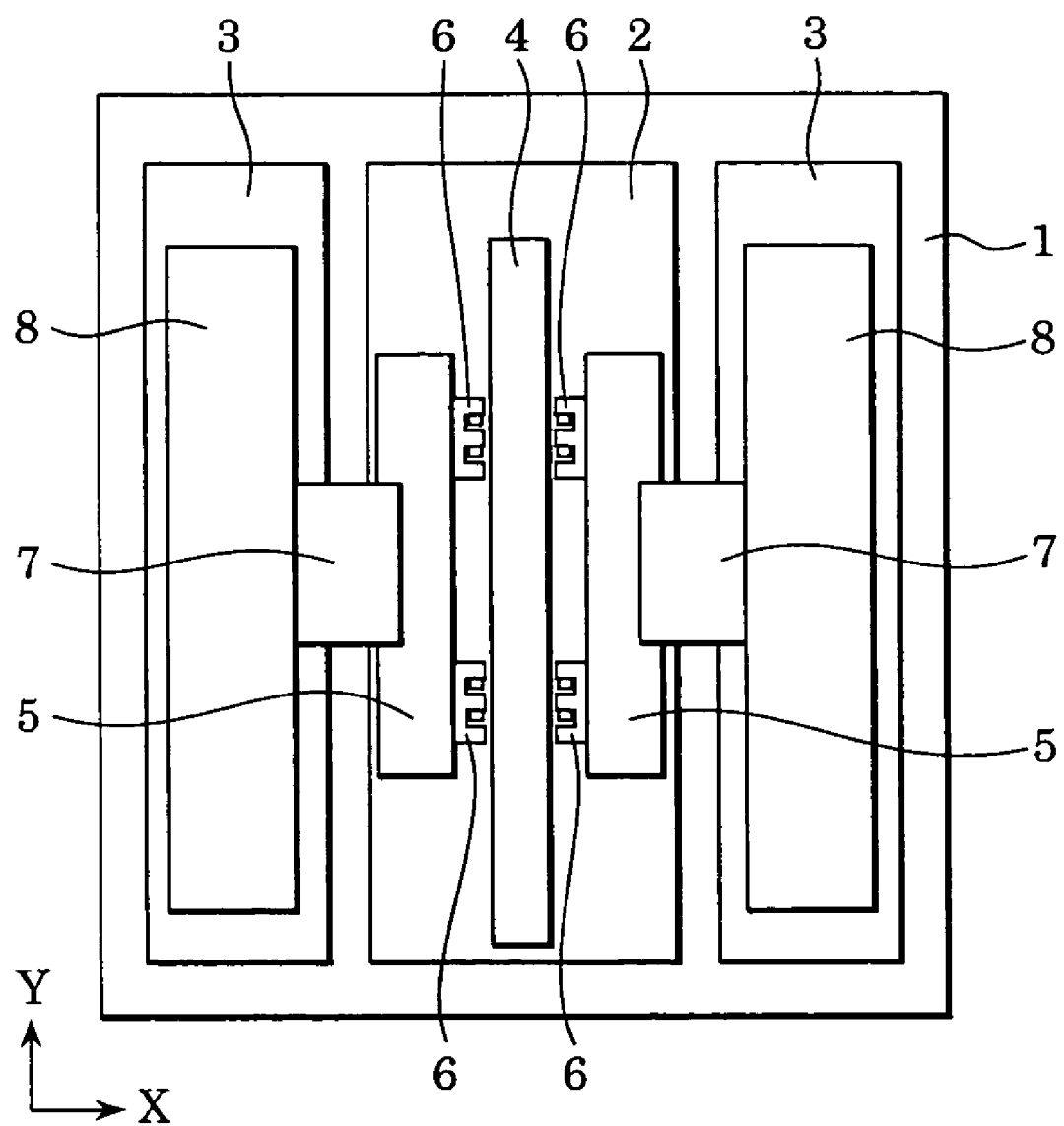
FIG. 3 is a bottom plan view showing part of the mask stage of FIG. 2.

First, a mask stage according to the embodiments of the present invention will be described with reference to FIGS. 2 and 3. FIG. 2 is a schematic perspective view showing a mask stage according to the embodiments of the present invention. FIG. 3 is a bottom plan view of a coarsely moving member of the mask stage of FIG. 2.

In the exposure apparatus using this mask stage, since its light source is a short wavelength light source, such as an EUV light source, it cannot use lenses and instead uses a reflective mask. Therefore, the mask stage is upside down. In this embodiment, a slider base 2 and two Y bases 3 are fixed on a main base 1. The slider base 2 is located in the middle of the main base 1 and between the Y bases 3. A linear motor stator 8 is fixed on each Y base 3 (i.e., there are two linear motor stators 8, one for each Y base 3). Right and left Y feet 5 are disposed on the slider base 2. Each Y foot 5 is supported by a hydrostatic air bearing (not shown) in the Z direction. Each Y foot 5 is provided with a moving magnet 7. As shown in FIG. 3, each Y foot 5 is further provided with E shaped electromagnets 6 (as can be seen from the figure, there are two such electromagnets 6 for each Y foot 5). Each electromagnet 6 has a coil. A magnetic plate 4 is fixed in the middle of the slider base 2. Each Y foot 5 slides in the Y direction without touching the magnetic plate 4 by means of a driving force between the moving magnet 7 and the linear motor stator 8 on the Y base 3. A second table 9 is fixed to the Y feet 5. The second table 9 supports a finely moving member. A first table 11 on which a mask is placed is hung from the second table 9 via 6 axis fine motion linear motors 10. A spring (not shown) is provided between the second table 9 and the first table 11 so as to support the weight of the first table 11.

Figure 1:
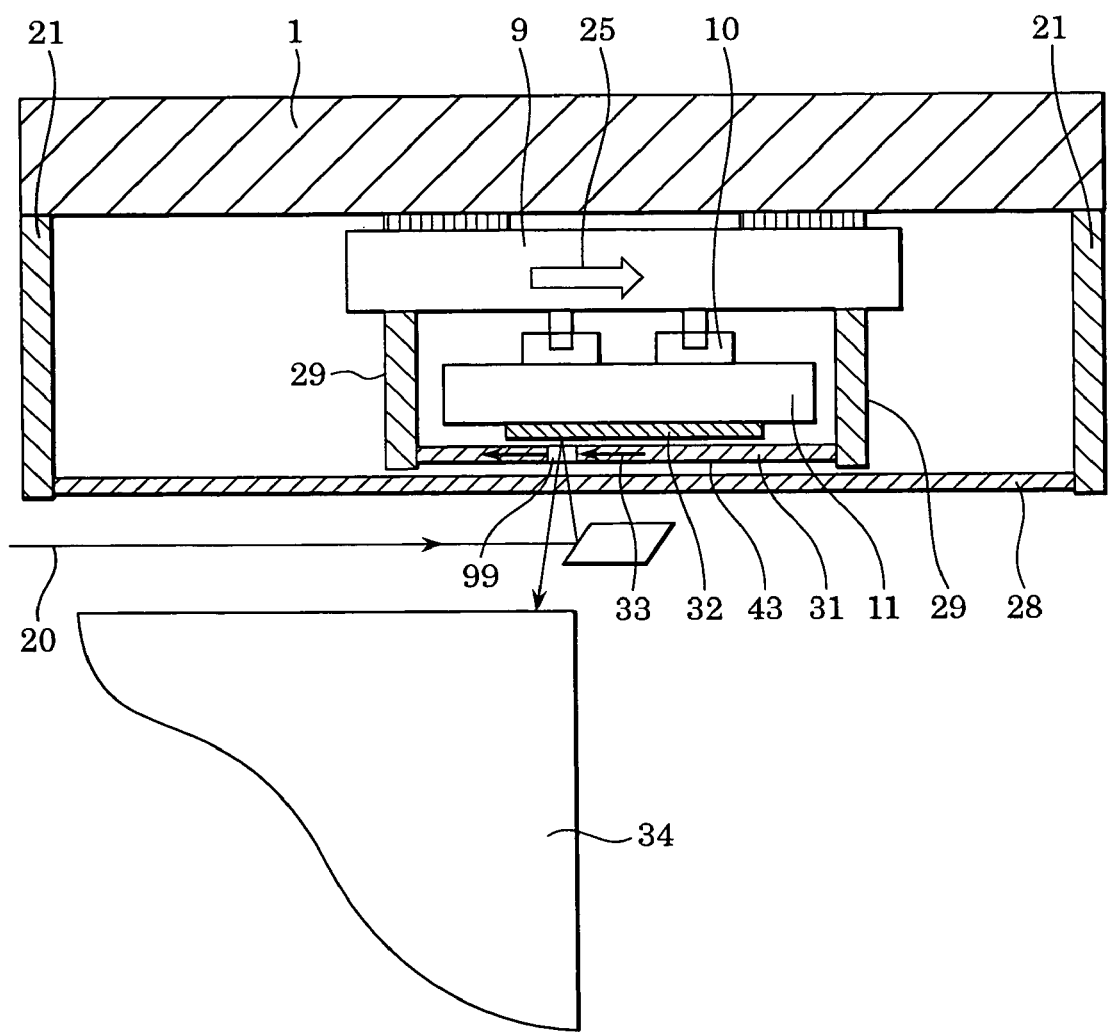
FIG. 1 is a side view showing a shade system mounted on a mask stage according to a first embodiment of the present invention.
Figure 4:
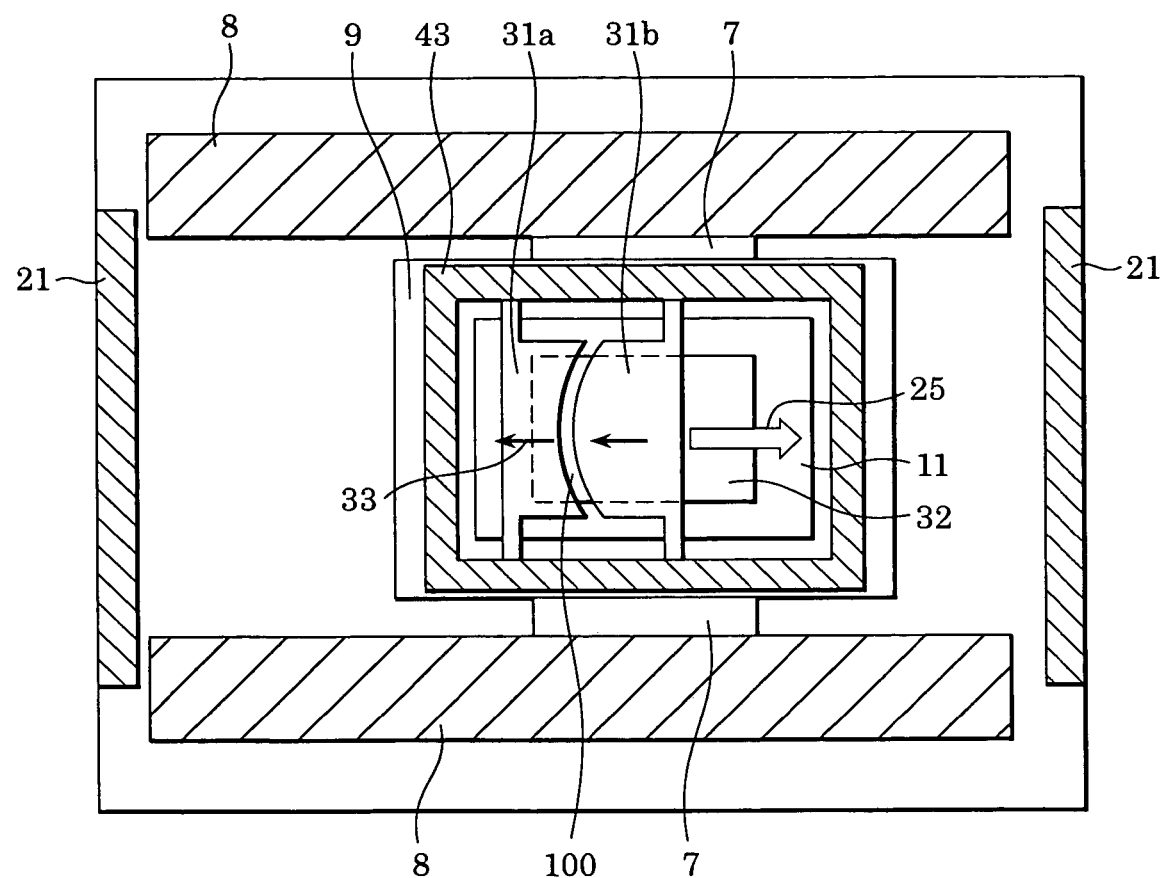
FIG. 4 is a bottom plan view showing a first shade of the shade system of FIG. 1.
Figure 5:
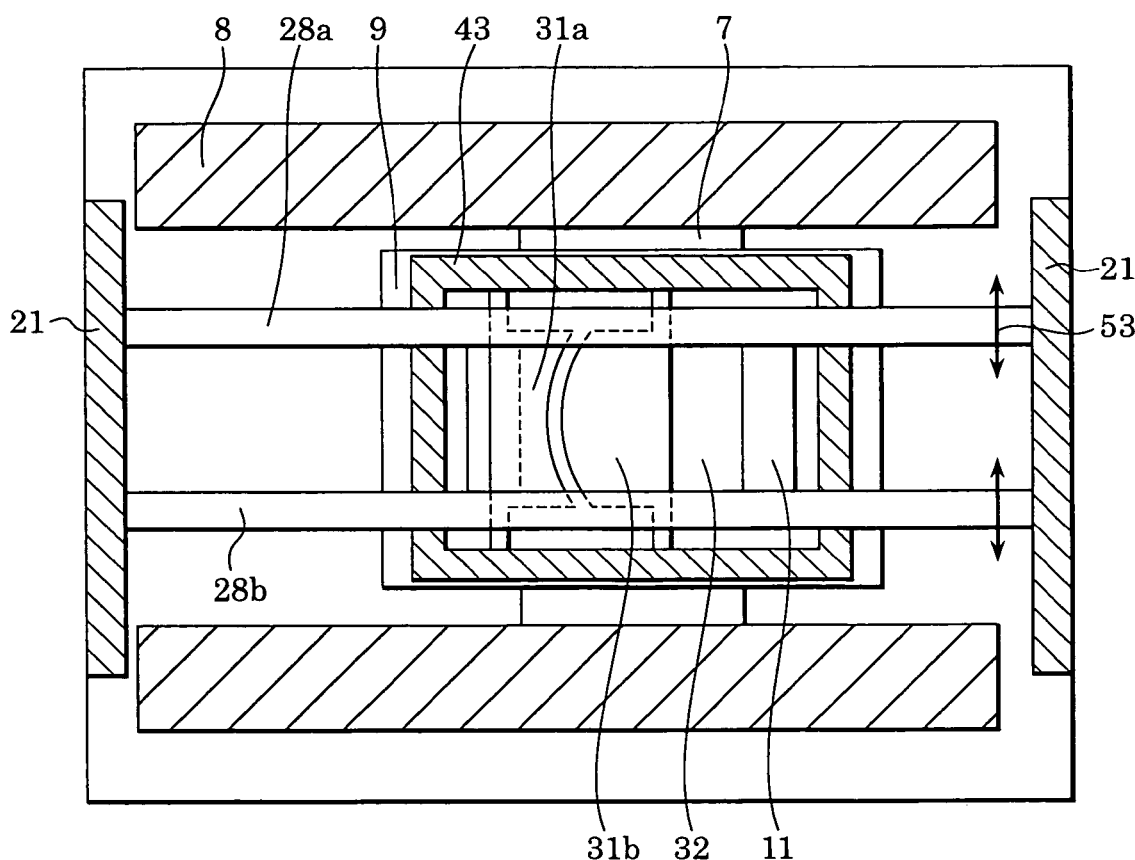
FIG. 5 is a bottom plan view showing a second shade of the shade system of FIG. 1.

The shade system according to the present invention is disposed under the mask stage shown in FIG. 2. FIG. 1 shows an embodiment including the shade system. FIG. 1 is a side view (in the X direction) of the mask stage of FIG. 2 together with the shade system. FIG. 4 is a bottom plan view showing the mask stage of FIG. 1, more specifically a first shade that moves in the scanning direction. FIG. 5 shows a second shade that is disposed under the first shade and can move in the nonscanning direction.

The first shade 31 is supported by the second table 9, which is a coarse motion stage capable of moving a long distance along the slider base 2. The first table 11 holding the mask 32 is driven by the linear motor 10 attached to the second table 9. Since the linear motors 7, 8, and 10 are arranged so that the first table 11 can magnetically levitate and move in six directions, the mask 32 can be positioned with a high degree of accuracy. That is to say, the first table 11 moves finely and the second table 9 moves coarsely.

The first shade 31 is supported by supports 29 at both ends of the second table 9. When the first shade 31 is driven, the vibration and reaction force are exerted on the second table 9. This disturbs the control of the second table 9. The first table 11 is controlled so as to correct the position error of the second table 9 due to the driving of the first shade 31. Therefore, positioning deviation of the mask 32 does not occur, and highly synchronized scanning can be performed. The linear motor 10 controlling the first table 11 is a coreless Lorentz type linear motor, in which power transmission is stable even if the position of the stator changes.

The first shade 31 moves in a direction 33 opposite to the direction 25 in which the second table 9 moves. The first shade 31 has a slit 99 with a fixed width for partly passing the light beam from an illumination system. Reference numeral 20 designates the center of the light beam. Since the first shade 31 reciprocates at a relatively low velocity, the actuator for moving the first shade 31 is the same linear motor as that for moving the second table 9.

Since the second shade 28 need not move in a synchronized manner with the scanning of the mask 32, the second shade 28 need not be mounted on the second table 9. The second shade 28 is supported by supports 21 extending from both ends of the main base 1 or the slider base 2 (not shown in FIG. 1). The main base and the slider base are not movable (but fixed), and the slider base supports the second table. In the case where there is no slider base, the main base supports the second table.

Figure 11:
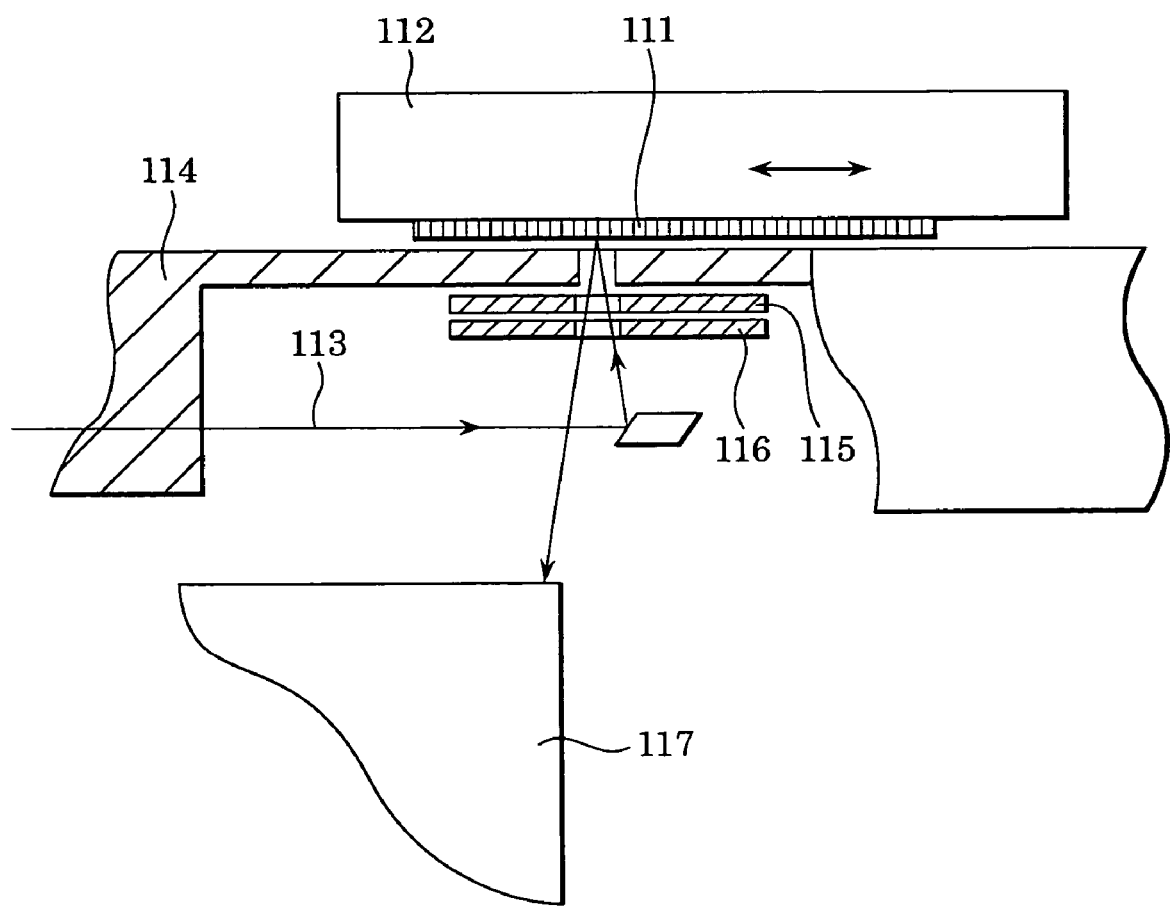
FIG. 11 shows a shade system (masking blade) of a conventional mask stage.

The second shade 28 is always farther than the first shade 31 (i.e., farther from the mask than the first shade 31). The blur caused by the shade system needs to be within the allowable range. In the conventional structure shown in FIG. 11, since the main base of the mask stage is between the shade system and the mask, the shade system cannot be disposed in the close vicinity of the mask in order to reduce blur. The blur in the nonscanning direction tends to be large. In the embodiments of the present invention, the mask stage is upside down, and the shade system is disposed under the mask stage. Therefore, the shade system can be disposed in the close vicinity of the mask so as to reduce blur.

The first shade will be described with reference to FIG. 4. The second table 9 is provided with a coarse motion linear motor (7, 8) on both sides. The coarse motion linear motor (7, 8) gives great driving force to the second table 9.

Supports extend downward from both ends of the second table 9. The supports 29 support a rectangular frame 43 including a guide (not shown) and an actuator (not shown) for driving the blades 31a and 31b (numeral 31 shown in FIG. 1) in the direction of arrow 33 opposite to the scanning direction 25 (i.e., arrow 25) synchronized with the scanning.

Since the light coming from the illumination system is arcshaped, the slit 100 between the blades 31a and 31b is also arcshaped. Unnecessary stray light that does not contribute to the illumination is obstructed by the blades 31a and 31b. When the blades 31a and 31b move, a fixed distance is constantly kept between them.

The relative relationship between the position of the mask stage and the position of the blades 31a and 31b is constantly measured and controlled.

The structure of the second shade will be described with reference to FIG. 5. In FIG. 5, the second shade is added to the mask stage of FIG. 4. Supports 21 extend downward from both ends of the main base 1 (as shown in FIG. 1) or the slider base 2 (not shown in FIG. 1). The supports 21 include a guide (not shown) and an actuator (not shown) for driving blades 28a and 28b in the nonscanning direction 53. The distance between the blades 28a and 28b corresponds to the width of the exposure range of the mask. The blades 28a and 28b need to be sufficiently long so as to cover the moving range of the first shade 31.

As described above, the second shade limits the width of exposure. The distance between the blades 28a and 28b is adjusted to the mask to be exposed and is not changed during scanning. Therefore, the second shade 28 is not mounted on the second table 9. By combining the first shade 31 and the second shade 28, the mask is constantly appropriately shaded.

Figure 6:
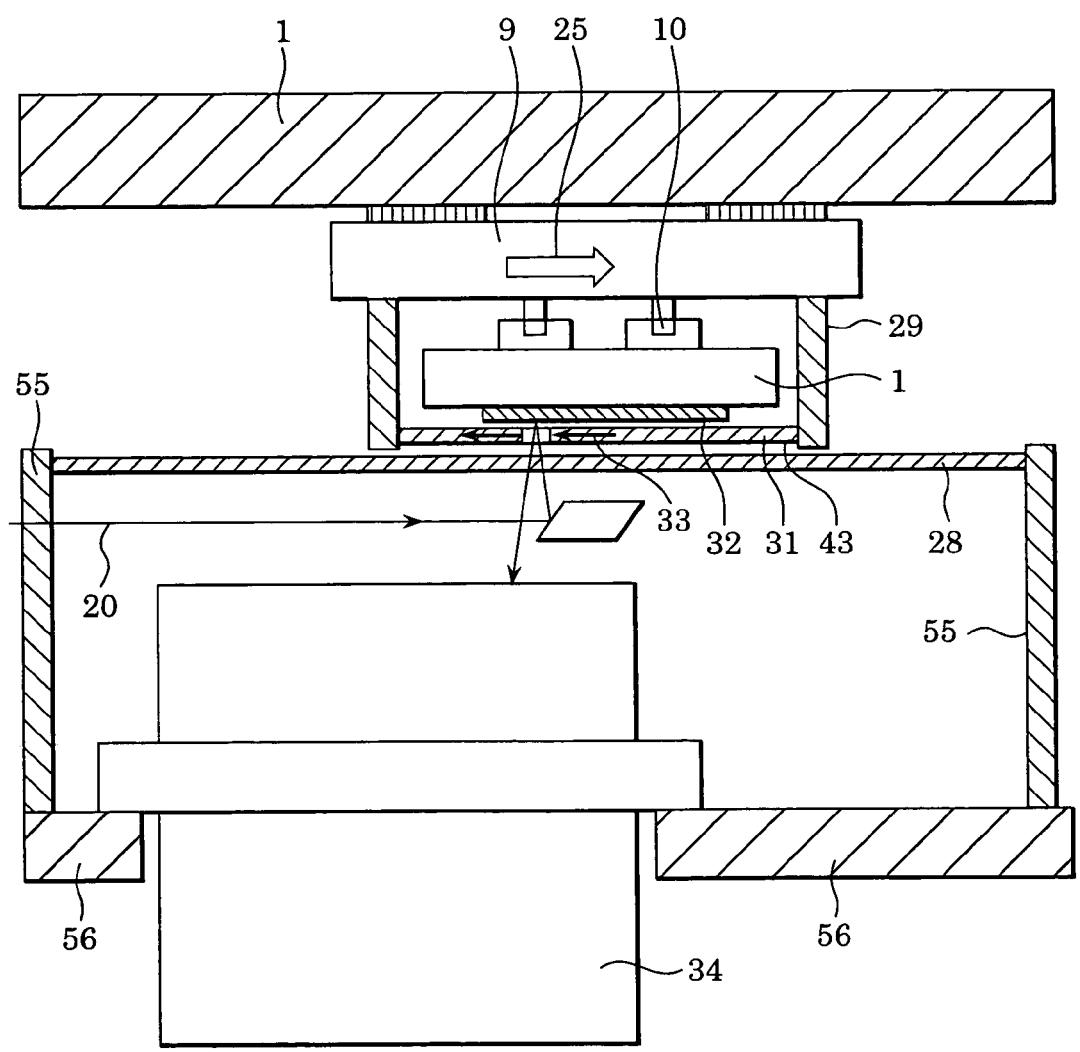
FIG. 6 is a side view showing another supporting structure of the second shade.

Although the second shade 28 is supported by the main base 1, the present invention is not limited to this. For example, as shown in FIG. 6, the second shade 28 may be supported by supports 55 extending upward from a base 56 that supports the projection optical system 34.

The second shade 28 is shifted only once before the exposure is started. Therefore, vibration or deformation due to driving does not affect the base 56 of the projection optical system 34. Therefore, stable exposure is ensured. Alternatively, the second shade 28 may be supported directly by the floor.

That is to say, as long as the relative relationship between the first shade and the second shade is kept on the basis of measurement and so on, the second shade may be supported by any supporting system.

Second Embodiment

Figure 7:
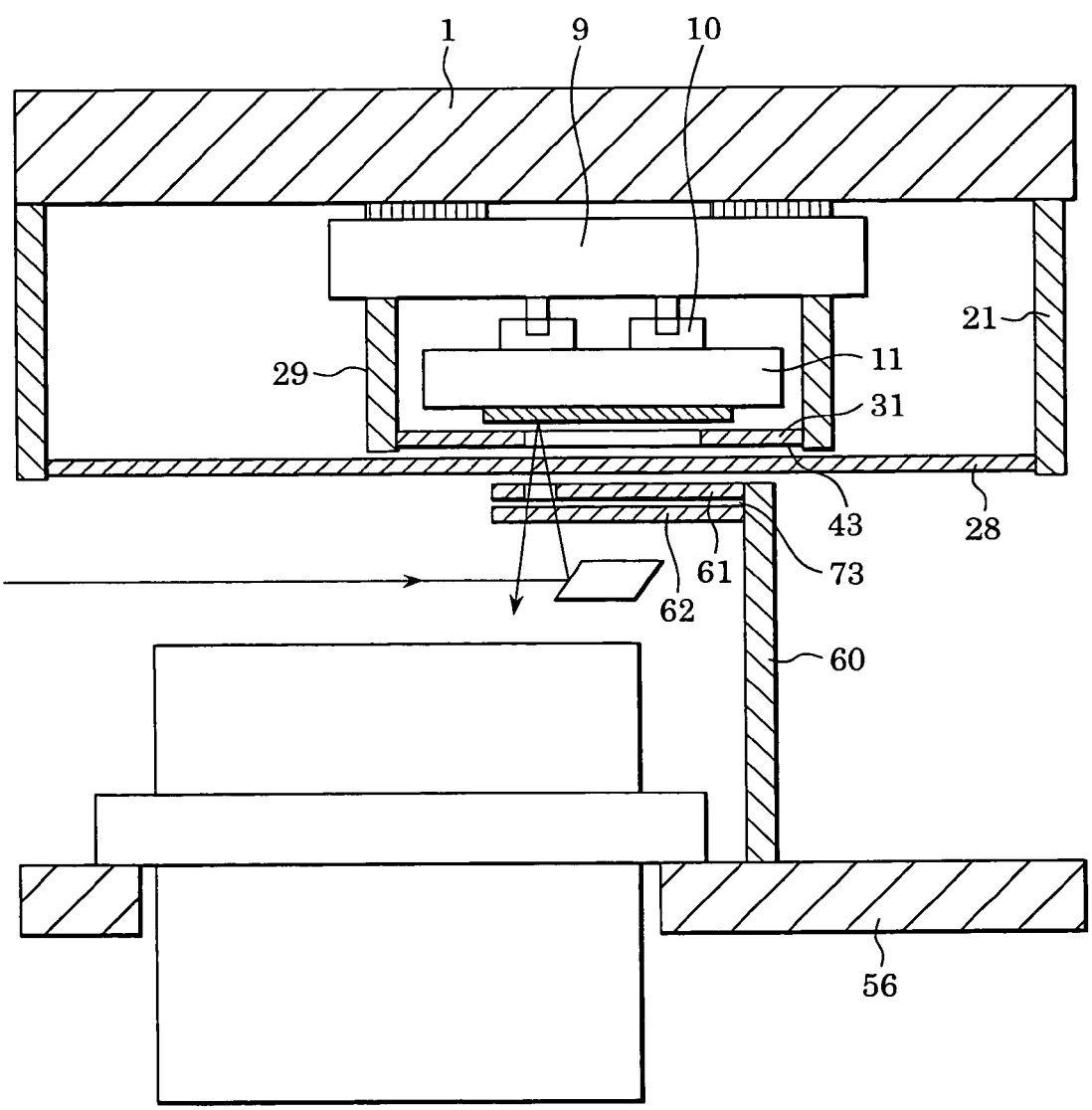
FIG. 7 is a side view showing first and second shade systems of a mask stage according to a second embodiment.

A second embodiment of the present invention will now be described with reference to FIGS. 7 to 9. In FIG. 7, a second shade system is added to the first shade system of FIG. 1. A first shade 61 and a second shade 62 of the second shade system are supported by a support 60 extending upward from the base 56 of the projection optical system. The first shade 61 is disposed between the mask stage and the illumination apparatus. In addition, the first shade 61 is farther away from the mask than the first shade system. The blur caused by the first shade 61 is within the allowable range.

In an exposure apparatus such as an EUV exposure apparatus, a mask is reflective. On the other hand, in the conventional exposure apparatuses, a mask transmits illumination light. In this case (i.e., the present invention), the second shade system may be disposed between the mask stage and the projection optical system.

Figure 10:
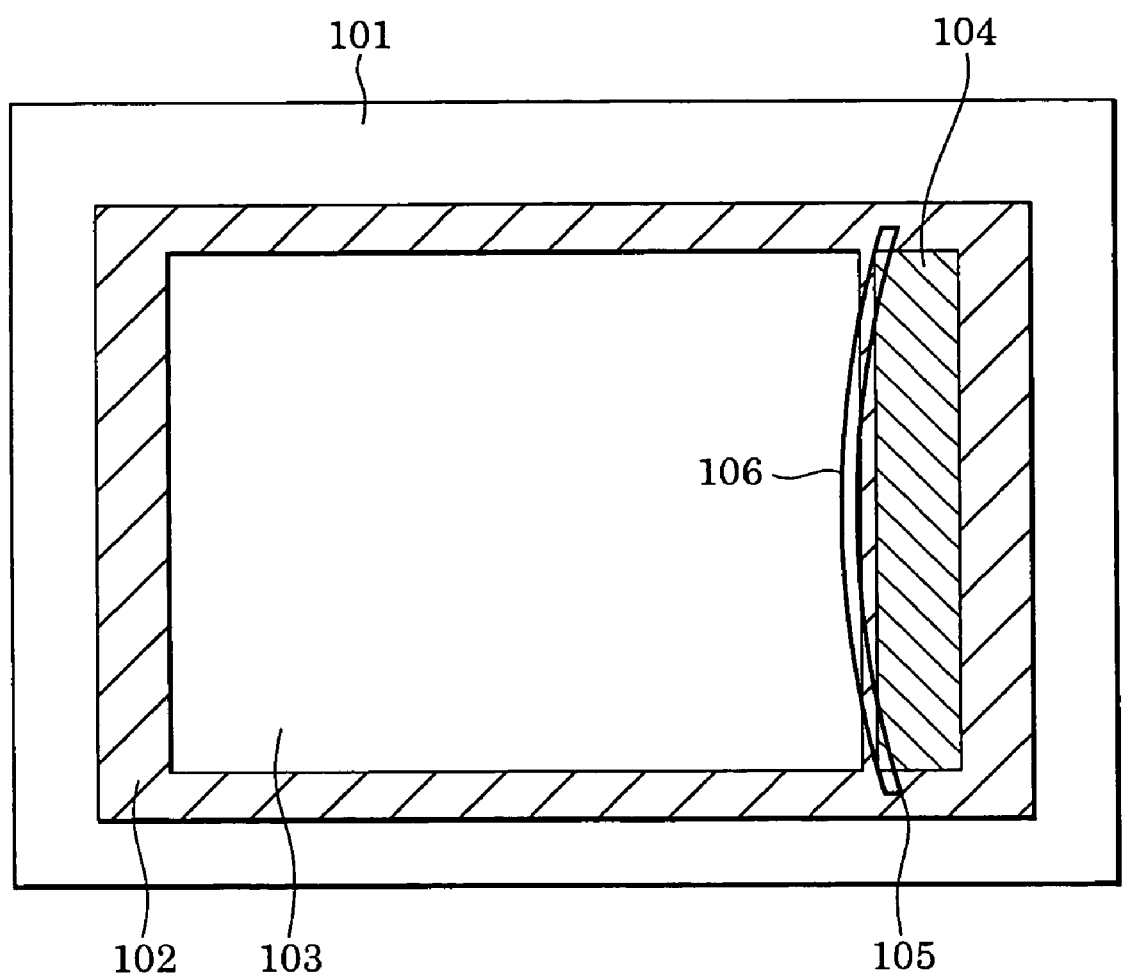
FIG. 10 shows a mask in which an undesired part is exposed.

By the two shade systems, limiting of the arcshaped illumination range and limiting of the exposure range can be performed separately. As described above, in the first embodiment, the arcshaped slit of the first shade 31 needs to move in a synchronized manner with the scanning. On the other hand, in the second embodiment, the formation of the arcshaped slit is performed by the second shade system. Therefore, the first shade 31 only has to limit the exposure range, and need not move in a synchronized manner with the scanning. In addition, accuracy of the first shade system becomes unnecessary, and the weight can be reduced. Moreover, undesired exposure described with reference to FIG. 10 can be prevented perfectly by the first shade system as shown in FIG. 8.

Figure 8:
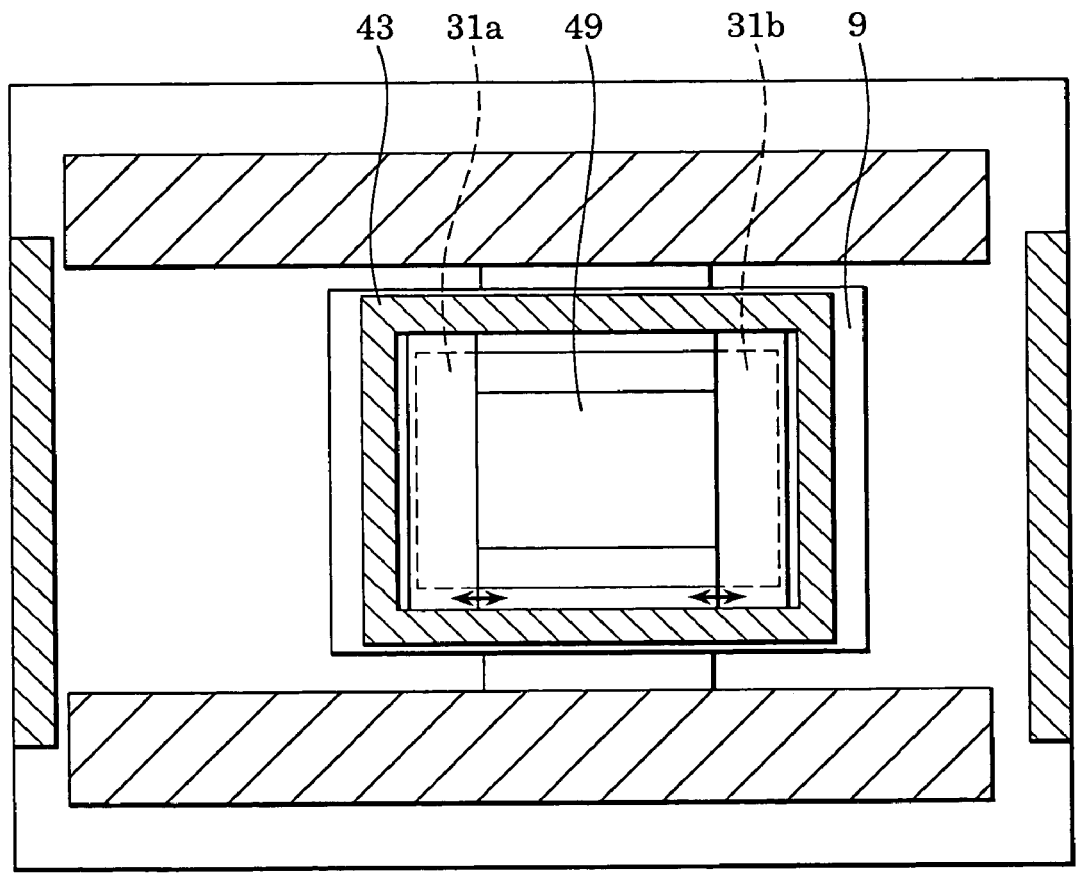
FIG. 8 is a bottom plan view showing the first shade system of FIG. 7.

FIG. 8 shows the structure of the first shade of the first shade system for limiting the exposure range in the scanning direction. The blades 31a and 31b can move so as to limit the exposure range 49 of the mask. In the case where only a test pattern (see FIG. 10) is exposed, the distance between the blades 31a and 31b is set to the width of the test pattern. The blades 31a and 31b can be locked by mechanical force or electromagnetic force so that the distance between them does not change during scanning.

The width of the blades in the scanning direction needs to be equal to or greater than the sum of the width of the arc, the acceleration/deceleration length necessary for turn of scanning, and the stabilization length.

As in the first embodiment, two supports extend downward from both ends of the second table 9, and the supports 29 support a rectangular frame 43 including a guide (not shown) and a linear motor (not shown) for driving the blades. In order to reduce friction, a hydrostatic air bearing with a labyrinth exhaust system, which can operate in a vacuum, is used for the guide.

The structure of the second shade of the first shade system for limiting the exposure range in the nonscanning direction may be the same as that in the first embodiment.

The structure of the second shade system will be described with reference to FIG. 9. As in the first shade system, the second shade system includes the first shade 61 (scanning direction) and the second shade 62 (nonscanning direction). In order to limit the illumination range, the first shade 61 has an arcshaped slit 121. A plurality of blades 74 to 81 form the arcshaped slit. The blades 74 to 81 can move separately, and can be adjusted in order to minimize unevenness in the illuminance. The blades 74 to 81 are connected to a rectangular drive member 73 and are driven by the drive member 73. The drive member 73 is supported by the supports 60. As in the second shade of the first shade system, the second shade 62 of the second shade system limits the illumination range with blades 62a and 62b. The blades 62a and 62b extend from a drive member included in the supports 60. Supports 60 can be supported by the main base 1 or the slider base 2 (not shown in FIG. 7). The main base and the slider base are not movable (but fixed), and the slider base supports the second table. In the case where there is no slider base, the main base supports the second table.

The second shade 62 of the second shade system is always disposed outside the second shade of the first shade system. Therefore, the second shade of the second shade system can be removed (i.e., can be omitted, resulting in three shades: the first and second shades of the first shade system and the first shade of the second shade system).

Figure 9:
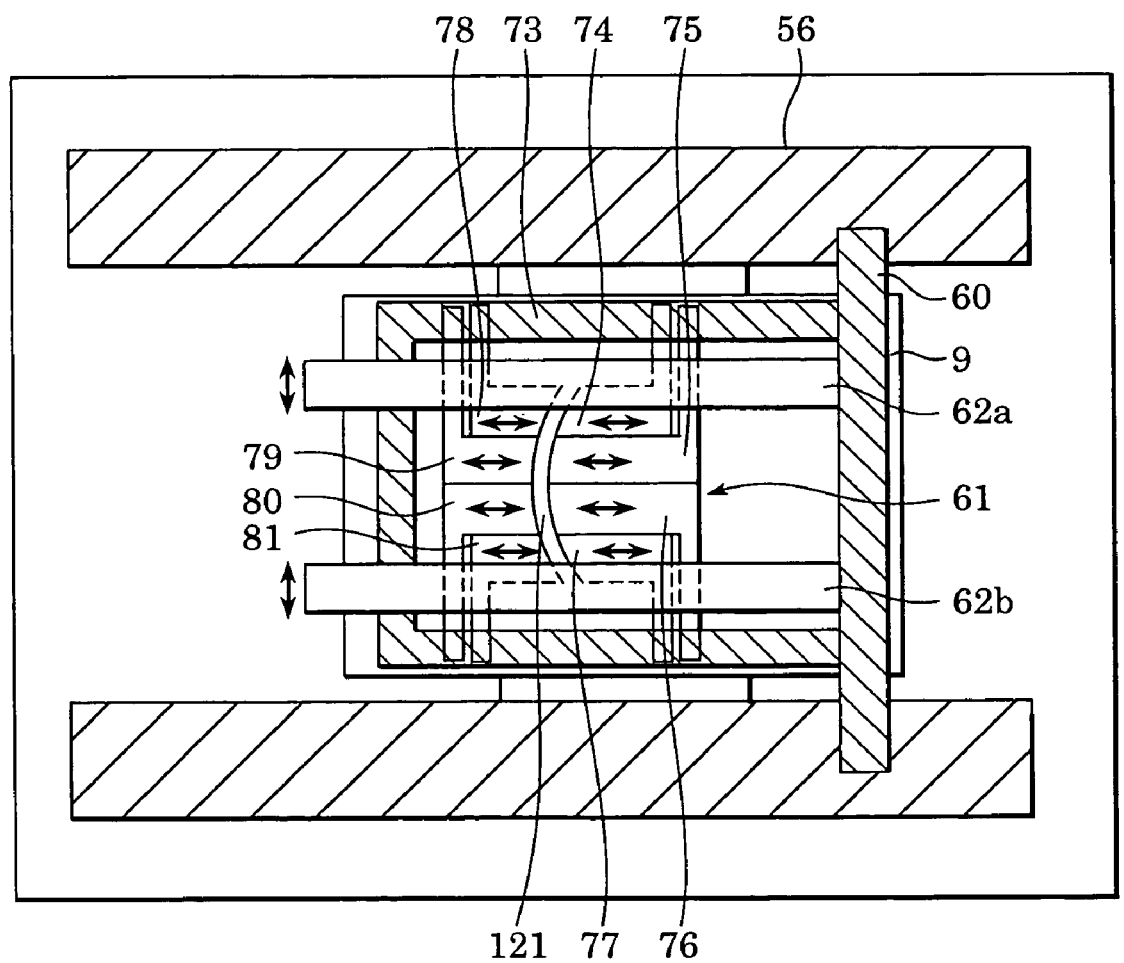
FIG. 9 is a bottom plan view showing the second shade system of FIG. 7.

Incidentally, the first shade of the first embodiment may have the same structure as that of the first shade including the blades 74 to 81 shown in FIG. 9.

As described above, even in the arcshaped illumination, high accuracy and productivity are achieved by separating the illumination range and the exposure range.

Although the illumination range is arcshaped in the above embodiments, the shape of the illumination range is not limited to this.

Third Embodiment

Figure 12:
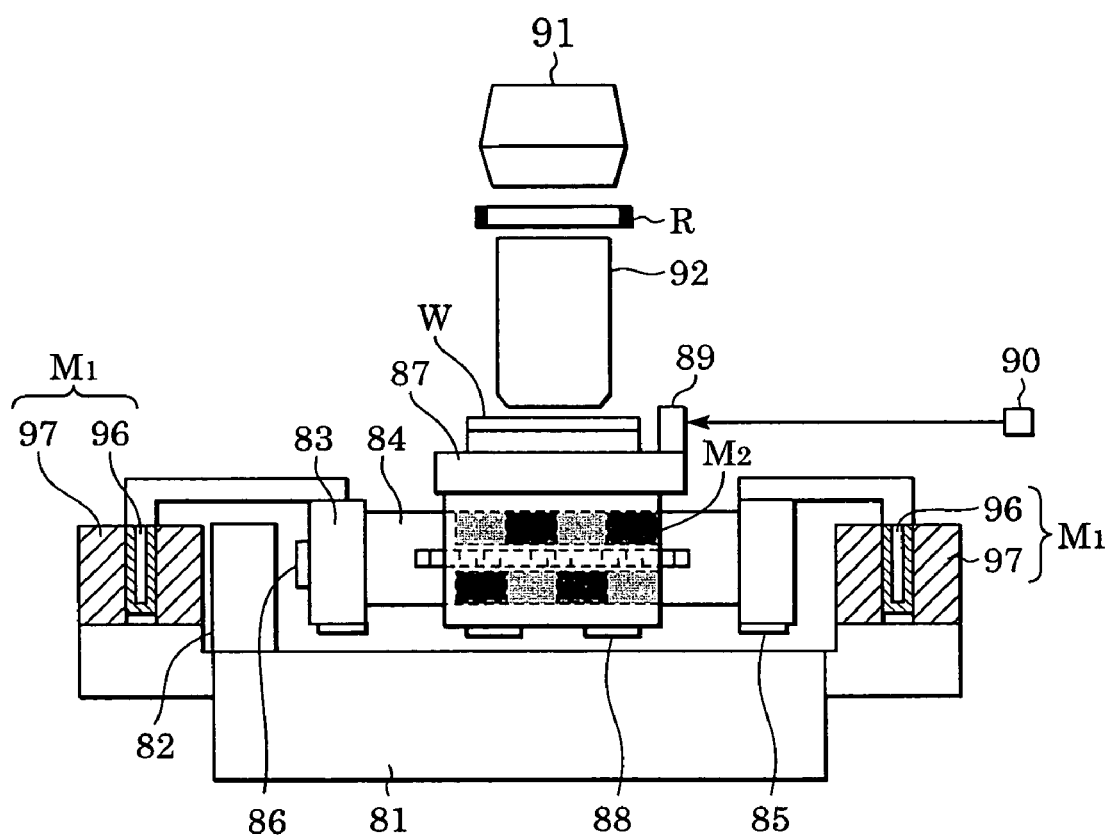
FIG. 12 shows an exposure apparatus for manufacturing a semiconductor device.

FIG. 12 shows an exposure apparatus including the above described mask stage.

This exposure apparatus is used for manufacturing a device that has a microscopic pattern, such as a semiconductor device, a micro machine, or a thin film magnetic head. This apparatus irradiates a semiconductor wafer W with exposure light coming from a light source 91 via a reticle (mask) R and a projection optical system 92, thereby forming a desired pattern on the wafer W. The term "exposure light" is a generic term used to refer to any of visible light, ultraviolet light, EUV light, X ray, an electron beam, a charged particle beam, and so on. The term "projection optical system" is a generic term used to refer to any of a refractor lens, a reflecting lens, a catadioptric lens system, a charged particle lens, and so on.

A guide 82 and two linear motors M1 are fixed on a base 81. In each linear motor M1, a stator 97 has a polyphase magnet coil, and a slider 96 has a plurality of permanent magnets. The sliders 96 are connected to movable members 83. The movable members 83 are connected to a movable guide 84 for a movable stage 87. The movable guide 84 is moved by the linear motors M1 perpendicular to the drawing. The movable members 83 are supported by the upper surface of the base 81 with hydrostatic bearings 85. One of the movable members 83 is also supported by the side surface of the guide 82 with another hydrostatic bearing 86.

The movable stage 87 is slidably mounted on the movable guide 84. The movable stage 87 is supported by other hydrostatic bearings 88. The movable stage 87 is driven by another linear motor M2. The movable stage 87 moves horizontally in the drawing along the movable guide 84. The movement of the movable stage 87 is measured using a mirror 89 fixed to the movable stage 87, and an interferometer 90.

A wafer W is held by a chuck mounted on the movable stage 87. The pattern of the reticle (mask) R is reduced and transferred onto the wafer W using the light source 91 and the projection optical system 92 by a step and repeat method or a step and scan method.

The linear motor system of the present invention can be used for a direct writing type exposure apparatus that directly writes a circuit pattern on a semiconductor wafer without using a mask.

Next, a process of manufacturing a semiconductor device using this exposure apparatus will be described. FIG. 13 shows the flow of the whole manufacturing process of a semiconductor device. In step 1 (circuit design), a semiconductor device circuit is designed. In step 2 (mask making), a mask having a designed circuit pattern is formed.

In step 3 (wafer fabrication), a wafer is manufactured using a material such as silicon. Step 4 (wafer process) is called a front end process. In step 4, an actual circuit is formed on the wafer by lithography using the above exposure apparatus. Step 5 (assembly) is called a back end process. In step 5, a semiconductor chip is made of the wafer manufactured in step 4. Step 5 includes an assembly process (dicing and bonding) and a packaging process (chip encapsulation). In step 6 (inspection), inspections such as an operation confirmation test and a durability test of the semiconductor device manufactured in step 5 are conducted. After these steps, the semiconductor device is completed and shipped in step 7.

The wafer process in step 4 includes the following steps. An oxidation step in which the surface of the wafer is oxidized, a CVD step in which an insulating film is formed on the wafer surface, an electrode formation step in which electrodes are formed on the wafer by vapor deposition, an ion implantation step in which ions are implanted in the wafer, a resist process step in which a photosensitive material is applied to the wafer, an exposure step in which the circuit pattern is transferred to the wafer with the above exposure apparatus, a development step in which the exposed wafer is developed, an etching step in which the wafer is etched except for the developed resist image, and a resist stripping step in which the resist is removed. These steps are repeated, and multilayer circuit patterns are formed on the wafer.

In the present invention, an exposure apparatus exposes a mask mounted on a table using an illumination apparatus. The illumination apparatus illuminates the mask with light from a light source. The exposure apparatus includes a shade system obstructing unnecessary stray light that does not contribute to the illumination. The shade system includes a first shade and a second shade. Each shade has a slit. The width of the slit (of each shade) is variable. The first shade can move in a first direction in which the table moves. The second shade can move in a second direction perpendicular to the first direction. The first shade and the second shade can be driven independently of each other. The table includes a first table and a second table. The first table holds the mask. The second table supports the first table and moves together with the first table. A first drive mechanism for driving the first shade is supported by the second table. A second drive mechanism for driving the second shade is supported by a base of the mask stage. Arcshaped light coming from the light source is obstructed by the shade system disposed under the mask stage. The mask stage is upside down, and the table is disposed not over the base of the mask stage but under the base. Therefore, the shade system can be disposed in the close vicinity of the mask.

The first shade is supported by the second table. The second shade is supported by the base of the mask stage.

The table can move the mask both coarsely and finely. The first table has a first linear motor for finely moving a short distance. The second table has a second linear motor for coarsely moving a long distance. Therefore, this mask stage is disturbance resistant, and the mask can be positioned with a high degree of accuracy. In this mask stage, the first shade is supported by the second table. Therefore, the vibration of the first shade is not transmitted to the first table, which directly holds the mask. The second shade is supported by the base of the mask stage. Therefore, both shading accuracy and mask moving accuracy are achieved.

The exposure apparatus may further include a second shade system disposed between the illumination apparatus and the (first) shade system. A shade limiting an illumination range and a shade whose slit width is variable are disposed independently of each other. For example, the shade limiting an illumination range is included in the first shade system, and the shade whose slit width is variable is included in the second shade system. Therefore, the shade whose slit width is variable need not move in a synchronized manner with the mask stage. The shade can be locked after it moves to the most appropriate position according to the illumination condition. Therefore, the first shade system need not change its position and the width of the arcshaped slit at the same time. Both the shade in the scanning direction and the shade in the nonscanning direction are locked after they move so as to surround the exposure range of the mask. Therefore, the shades need not move in a synchronized manner, and the mask stage can use a low cost actuator and a simple mechanism.

The shade system may be disposed in the illumination apparatus. In the present invention, a method for manufacturing a semiconductor device includes the step of manufacturing a semiconductor device using any one of the above exposure apparatuses.

As described above, in the present invention, a shade in the scanning direction is mounted on a mask stage. Therefore, the gap between the mask and the shade can be reduced without deteriorating the stage accuracy. The blur can be reduced, and excellent exposure performance is achieved. In the case of the arcshaped illumination, an undesired part is prevented from being illuminated by two shade systems. Since the illumination range and the exposure range are shaded separately so that the structure is simple, high accuracy is achieved at low cost.

Except as otherwise disclosed herein, the various components shown in outline or in block form in the figures are individually well known and their internal construction and operation are not critical either to the making or using of this invention or to a description of the best mode of the invention.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004128679 filed Apr. 23, 2004, which is hereby incorporated by reference herein.

What is claimed is:

1. An exposure apparatus comprising:
   a first movable table on which a mask is mounted;
   a second movable table on which the first movable table is mounted;
   a fixed body on which the second movable table is mounted; and
   a shade system obstructing a part of light radiated toward the mask, the shade system comprising
   (a) a first shade for forming a slitshaped range of illumination of the mask,
   (b) a second shade limiting a range of exposure of the mask, wherein the first shade and the second shade are supported separately;
   (c) a first drive mechanism driving the first shade; and
   (d) a second drive mechanism driving the second shade,
   wherein the first drive mechanism is supported by the second movable table, and the second drive mechanism is supported by the fixed body.

2. The exposure apparatus according to claim 1, further comprising:
   a fine motion drive mechanism provided between the movable table and the second movable table; and
   a coarse motion drive mechanism provided between the second movable table and the fixed body.

3. The exposure apparatus according to claim 1, wherein the first shade moves synchronized with the second movable table.

4. The exposure apparatus according to claim 1, wherein the first shade comprises a pair of blades arranged to limit an exposure range in a first direction that the movable table moves.

5. The exposure apparatus according to claim 1, wherein the first shade comprises a plurality of blades.

6. The exposure apparatus according to claim 1, wherein the first shade and the second shade are formed of a material absorbing EUV light.

7. A method for manufacturing semiconductor devices, the method comprising the steps of: exposing a wafer by using the exposure apparatus according to claim 1; and developing the wafer.

8. An exposure apparatus comprising:
   a movable table on which a mask is mounted; and
   a shade system obstructing a part of light radiated toward the mask, the shade system comprising
   (a) a first shade obstructing light for limiting an exposure range in a first direction that the movable table moves,
   (b) a second shade obstructing light for limiting an exposure range in a second direction perpendicular to the first direction, and
   (c) a third shade for forming a slitshaped range of illumination of the mask, wherein the first shade, the second shade, and the third shade are supported separately.

9. The exposure apparatus according to claim 8, wherein the shade system further comprises:
   (d) a first drive mechanism driving the first shade; and
   (e) a second drive mechanism driving the second shade,
   wherein the first drive mechanism is supported by a second movable table on which the movable table is mounted, and the second drive mechanism is supported by a fixed body supporting the second movable table.

10. The exposure apparatus according to claim 8, wherein the third shade is supported by a base that supports a projection optical system.

11. The exposure apparatus according to claim 9, wherein the third shade is supported by a fixed body supporting the second movable table.

12. An exposure apparatus comprising:
   a base;
   a first movable table configured to mount a mask thereon;
   a second movable table configured to mount the first movable table thereon;
   a first shade comprising two blades configured to have an arcshaped slit therebetween so as to form an arcshaped slit range of illumination of the mask; and
   a second shade configured to adjustably limit a range of exposure of the mask,
   wherein said first shade is movably mounted on said second movable table, and said second shade is not mounted on said first and second movable tables.

13. An exposure apparatus according to claim 12, wherein said second shade is mounted on said base.

14. An exposure apparatus according to claim 13, wherein said second shade comprises a plurality of blades movable with respect to the base.

15. An apparatus according to claim 12, wherein said second movable table moves relative to said base for coarse adjustment and said first movable table moves relative to said second movable table for fine adjustment.

16. An apparatus according to claim 12, wherein the mask is a reflective mask for reflecting illumination to form a pattern on a wafer, and the illumination is selected from the group consisting of (a) extreme ultraviolet light in the range of 10–200 nm and (b) X ray.

17. An apparatus according to claim 12, wherein said first shade is separated from the mask by only an air gap.

* * * * *

UNITED STATES PATENT AND TRADEMARK OFFICE
CERTIFICATE OF CORRECTION

PATENT NO. : 7,184,127 B2  Page 1 of 1
APPLICATION NO. : 11/108716
DATED : February 27, 2007
INVENTOR(S) : Hiroyoshi Kubo It is certified that error appears in the above-identified patent and that said Letters Patent is hereby corrected as shown below:

COLUMN 1:
　　Line 20, "No. 11219900" should read -- No. 11-219900 --.
　　Line 26, "2003045784. The" should read -- 2003-045784. The --.
　　Line 28, "No. 04196513" should read -- No. 04-196513 --.

COLUMN 6:
　　Line 64, "above" should read -- above- --.

COLUMN 9:
　　Line 37, "comprising" should read -- comprising: --.
　　Line 39, "mask," should read -- mask; --.

COLUMN 10:
　　Line 2, a new paragraph indent should be inserted before "exposing".
　　Line 4, a new paragraph indent should be inserted before "developing".
　　Line 8, "comprising" should read -- comprising: --.
　　Line 16, a new paragraph indent should be inserted before "wherein the first shade, the."

Signed and Sealed this

Twenty-eighth Day of August, 2007

JON W. DUDAS
*Director of the United States Patent and Trademark Office*